(12) United States Patent
Lee

(10) Patent No.: US 8,836,382 B1
(45) Date of Patent: Sep. 16, 2014

(54) MIXED VOLTAGE DRIVING CIRCUIT

(71) Applicant: Via Technologies, Inc., New Taipei (TW)

(72) Inventor: Yeong-Sheng Lee, Fremont, CA (US)

(73) Assignee: Via Technologies, Inc., New Taipei (TW)

( * ) Notice: Subject to any disclaimer, the term of this patent is extended or adjusted under 35 U.S.C. 154(b) by 0 days.

(21) Appl. No.: 13/892,570

(22) Filed: May 13, 2013

(51) Int. Cl.
*H03B 1/00* (2006.01)
*H03K 17/16* (2006.01)

(52) U.S. Cl.
CPC .................................... *H03K 17/16* (2013.01)
USPC .............................. 327/108; 327/540; 326/60

(58) Field of Classification Search
None
See application file for complete search history.

(56) References Cited

U.S. PATENT DOCUMENTS

| | | | | |
|---|---|---|---|---|
| 5,087,834 A | * | 2/1992 | Tsay | 326/33 |
| 5,202,590 A | * | 4/1993 | Liepold et al. | 327/77 |
| 5,579,193 A | * | 11/1996 | Schmidt et al. | 361/18 |
| 6,157,178 A | * | 12/2000 | Montanari | 323/273 |
| 6,177,809 B1 | * | 1/2001 | Tonti et al. | 326/83 |
| 6,433,769 B1 | * | 8/2002 | Cato | 345/101 |
| 7,023,497 B2 | * | 4/2006 | Fang et al. | 348/694 |
| 7,633,482 B2 | * | 12/2009 | Chang et al. | 345/100 |
| 7,843,247 B1 | * | 11/2010 | Bazes | 327/333 |
| 8,514,006 B2 | * | 8/2013 | Cooney et al. | 327/333 |
| 8,536,905 B2 | * | 9/2013 | Uchino et al. | 327/108 |
| 2008/0143697 A1 | * | 6/2008 | Kojima | 345/204 |
| 2008/0259070 A1 | * | 10/2008 | Snyder et al. | 345/212 |

* cited by examiner

*Primary Examiner* — Thomas J Hiltunen
(74) *Attorney, Agent, or Firm* — McClure, Qualey & Rodack, LLP

(57) ABSTRACT

A driving circuit is provided. The driving circuit has: a level shifter configured to receive a reference voltage and an input signal at a first voltage to generate a second voltage; an differential amplifier, coupled to the level shifter, configured to receive the second voltage and an output signal to provide an operating voltage, wherein the differential amplifier is supplied by a first power source at a third voltage; and an output stage, coupled to the differential amplifier, configured to receive the input signal and the operating voltage for switching the output signal, wherein the first voltage is smaller than the third voltage, and the output signal has a fourth voltage between the first voltage and the third voltage.

9 Claims, 6 Drawing Sheets

US 8,836,382 B1

MIXED VOLTAGE DRIVING CIRCUIT

CROSS REFERENCE TO RELATED APPLICATIONS

BACKGROUND OF THE INVENTION

1. Field of the Invention

The present invention relates to a driving circuit, and in particular, to a driving circuit configured to solve mixed voltage issues in current portable systems.

2. Description of the Related Art

Recently, mixed voltage sources are commonly adapted to different components, such as analog circuits and digital circuits, of an integrated circuit (IC) in a portable system or any electronic system. For example, analog circuits and digital circuits in an IC may use different voltage levels. In addition, an extra voltage level other than the two voltage sources used in the analog circuits and digital circuits might be further used in the same IC due to IC manufacturing process issues. That is, some cells or components in the IC may be required to be supplied with an extra voltage level. Accordingly, a complicated driving circuit is usually used in the conventional IC for providing the extra voltage level, which hinders miniaturization and increases power consumption thereof.

BRIEF SUMMARY OF THE INVENTION

A detailed description is assuming in the following embodiments with reference to the accompanying drawings.

In an exemplary embodiment, a driving circuit is provided. The driving circuit comprises: a level shifter configured to receive a reference voltage and an input signal at a first voltage to generate a second voltage; an operational amplifier, coupled to the level shifter, configured to receive the second voltage and an output signal to provide an operating voltage, wherein the operational amplifier is supplied by a first power source at a third voltage; and an output stage, coupled to the operational amplifier, configured to receive the input signal and the operating voltage for switching the output signal, wherein the first voltage is smaller than the third voltage, and the output signal has a fourth voltage between the first voltage and the third voltage.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is made for the purpose of illustrating the general principles of the invention and should not be taken in a limiting sense. The scope of the invention is best determined by reference to the appended claims.

Figure 1:
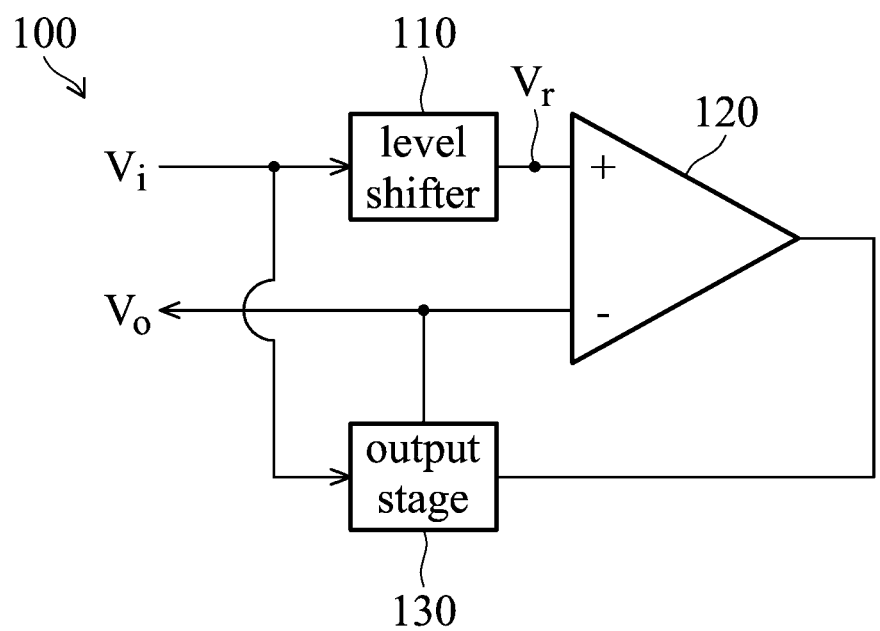
FIG. 1 is a block diagram of a driving circuit 100 according to an embodiment of the invention.

Systems may have different voltage levels for operation voltages for analog circuits (such as 1.8V) and digital circuits (such as 1.0V). Different specifications may further require using signal voltage levels different from these operation voltages. For example, the MIPI (Mobile Industry Processor Interface) specification requires generating an output signal with voltage levels of 0V and 1.2V. Therefore, a driving circuit to generate such voltage levels with driving capability is required. FIG. 1 is a block diagram of a driving circuit 100 according to an embodiment of the invention. The driving circuit 100 may comprise a level shifter 110, a differential amplifier 120, and an output stage 130. Referring to FIG. 1, the level shifter 110 may be coupled to an input signal $V_i$ (having a first voltage level) and a reference voltage $V_{ref}$ (having a second voltage level), and output a reference signal $V_r$ to a first input terminal (e.g. the positive terminal in FIG. 1) of the differential amplifier 120. The second voltage level of the reference voltage $V_{ref}$ represents the desired voltage level of the output signal $V_o$ of the driving circuit 100, and may be generated by a bandgap voltage reference circuit which does not have current driving capability (details will be discussed later). The output terminal of the differential amplifier 120 and the second input terminal of the differential amplifier 120 are coupled to the output stage 130. The output stage 130 is also coupled to the input signal $V_i$ as another input, and provides an output signal $V_o$, which is the output of the driving circuit 100. The differential amplifier 120 and the output stage 130 may both be operated by an operation voltage having a third voltage level. In one embodiment, the third voltage level is higher than the first voltage level, and the second voltage level is in between of the first and third voltage level. When a negative feedback loop is formed via the output stage 130, the first and second input terminals of the differential amplifier 120 become virtually shorted, and thus the signal at the second input terminal of the differential amplifier 120 (i.e., $V_o$) is exactly the same as the reference signal $V_r$ at the first input terminal of the differential amplifier 120.

Figure 2A:
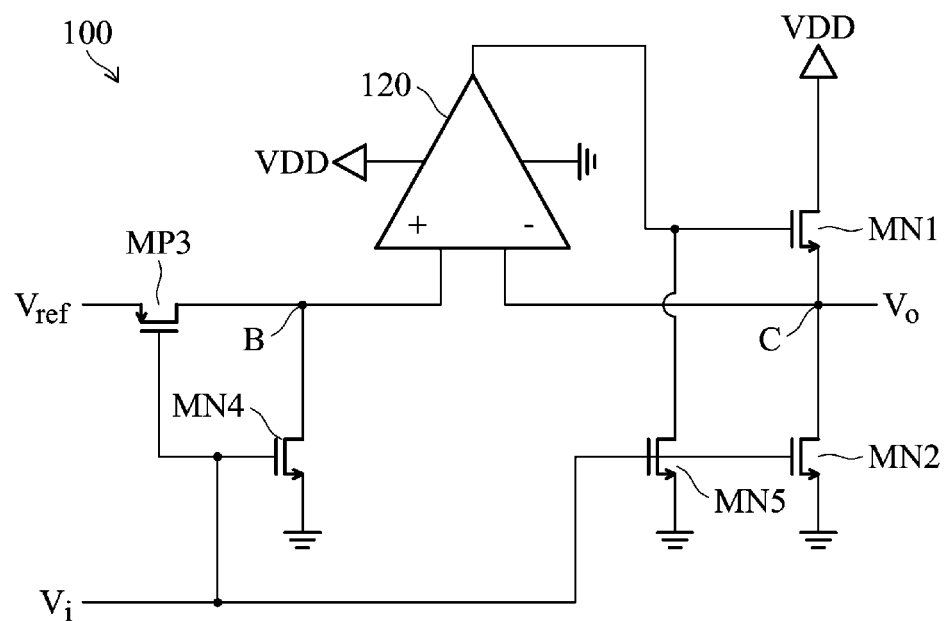
FIG. 2A is a detailed circuit schematic diagram of the driving circuit 100 according to an embodiment of the invention.

FIG. 2A is a detailed circuit schematic diagram of the driving circuit 100 according to an embodiment of the invention. The operations of each component of the driving circuit 100 will be described. The operations of the level shifter 110 are based on the input signal $V_i$. The input signal $V_i$ is coupled to the gate of a P-type field-effect transistor (hereinafter as PFET) MP3 and the gate of an N-type field-effect transistor (hereinafter as NFET) MN4. The source terminal of the NFET MN4 is coupled to the ground. The source terminal of the PFET MP3 is coupled to the reference voltage $V_{ref}$. The drain terminals of the NFET MN4 and the PFET MP3 are both coupled at node B to the first input terminal of the differential amplifier 120. Accordingly, the reference signal $V_r$ can be obtained at the node B according to the input signal $V_i$. For example, assuming that $V_i$ is at a low logic level of 0V and $V_{ref}$ is at a fixed voltage of 1.2V, the PFET MP3 is turned on and the NFET MN4 is turned off, so that the reference signal $V_r$ is approximately at a voltage level of 1.2V. Assuming that $V_i$ is at a high logic level of 1.0V, the NFET MN4 will be turned on, so that the reference signal $V_r$ at the node B will be pulled down to 0V. The operations of the output stage 130 are also based on the input signal $V_i$. The output stage 130 comprises NFETs MN1, MN2, and MN5. Both the gate terminals of NFET MN2 and MN5 are controlled by the input signal $V_i$, and both the source terminals of NFET MN2 and MN5 are coupled to ground. The drain terminal of the NFET MN5 is coupled to the output terminal of the differential amplifier 120, and the drain terminal of the NFET MN2 is coupled to the second input terminal of the differential amplifier 120 which provides the output signal $V_o$. NFET MN1 has a gate terminal coupled to the output terminal of the differential amplifier 120, a source terminal coupled to the second input terminal of the differential amplifier 120, and a drain terminal coupled to an operation voltage VDD. Accordingly, a negative feedback loop can be established at the differential amplifier 120 according to the input signal $V_i$. For example, assuming that $V_i$ is at a low logic level of 0V, the NFETs MN2 and MN5 are turned off, so that the NFET MN1 forms a negative feedback loop from the output terminal to the second input terminal of the differential amplifier 120. Therefore, the first and second input terminals of the differential amplifier 120 become a virtual short, and thus the output signal $V_o$ at the second input terminal of the differential amplifier 120 is exactly the same as the reference signal $V_r$ at the first input terminal of the differential amplifier 120 (which is now approximately 1.2V as discussed above). Assuming that $V_i$ is at a high logic level of 1.0V, the transistors MN2 and MN5 are turned on, so that the NFET MN1 is turned off and there is no feedback loop. The output signal $V_o$ will be pulled down to 0V by NFET MN2. During this time, the reference signal $V_r$ also happens to be 0V as discussed above; however, this is not due to virtual short. The pull-up NFET MN1 and pull-down NFET MN2 of the output stage 130 provides driving capability to drive subsequent circuits. In addition, since both pull-up and pull-down transistors are fabricated by NFETs, it can save chip area because the driving capability of NFETs is typically two to three times higher than that of PFETs. The differential amplifier 120 may also be operated by the operation voltage VDD having a third voltage level (e.g., 1.8V). In another embodiment, the reference voltage $V_{ref}$ may be directly coupled to the first input terminal of the differential amplifier 120 without the level shifter 110. Since virtual short between the first and second input terminals of the differential amplifier 120 is not established when $V_i$ is at a high logic level, the output signal $V_o$ will be pulled down to 0V regardless of the signal level at the first input terminal of the differential amplifier 120. In another embodiment, the field-effect transistors may be substituted with bipolar-junction transistors.

Figure 2B:
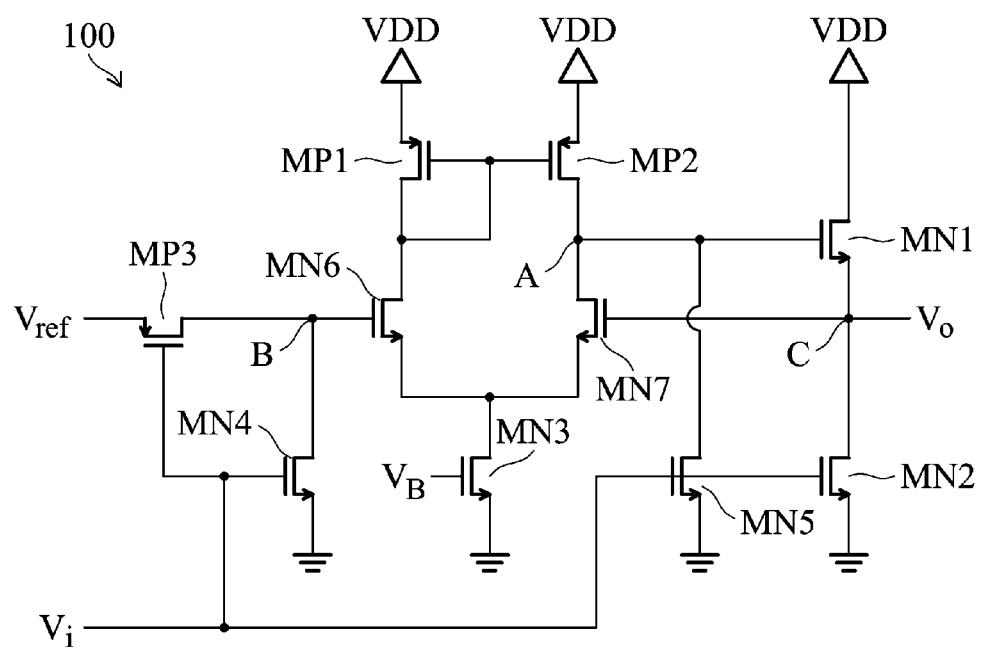
FIG. 2B shows an example of the differential amplifier 120 of the driving circuit 100 according to an embodiment of the invention.

FIG. 2B shows an example of the differential amplifier 120 of the driving circuit 100 according to an embodiment of the invention. As illustrated in FIG. 2B, an exemplary differential amplifier 120 is supplied with an operation voltage VDD (such as 1.8V), and provides an output voltage $V_a$ at the node A (i.e., the output terminal of the differential amplifier 120). The differential amplifier 120 is coupled to the operation voltage VDD via the PFET pair MP1 and MP2, and is coupled to ground via the NFET MN3. The gate terminal of NFET MN3 is controlled by a bias voltage $V_B$, which is capable of turning on/off the NFET MN3 to enable/disable the differential amplifier 120. In another embodiment, the differential amplifier 120 is coupled to ground via a current source (i.e., the source terminals of the NFETs MN6 and MN7 are coupled to a current source which is coupled to ground). The first input terminal (i.e. gate terminal of the transistor MN6) of the differential amplifier 120 is coupled to the node B having the reference signal $V_r$. The second input terminal (i.e. gate terminal of the transistor MN7) is coupled to the node C at the output stage 130, thereby providing the output signal $V_o$ of the driving circuit 100. Note that, for one having ordinary skill in the art, it is appreciated that the differential amplifier 120 can be implemented in various ways. In one embodiment, the differential amplifier 120 may be implemented with BJTs (bipolar junction transistor).

The output stage 130 is supplied with several input voltage levels, such as VDD, $V_a$, and $V_i$. For example, the drain terminal of the NFET MN1 is supplied with the operation voltage VDD. The gate terminal of the NFET MN1 and the drain terminal of the NFET MN5 are coupled to the node A having the voltage level $V_a$ (i.e., the output terminal of the differential amplifier 120). The gate terminal of the NFET MN5 and the gate terminal of the NFET MN2 are coupled to the input signal $V_i$. The source terminal of the NFET MN1 and the drain terminal of the NFET MN2 are both coupled to the second input terminal of the differential amplifier 120 (i.e. gate terminal of the NFET MN7). The source terminal of the NFET MN2 and the source terminal of the NFET MN5 are both coupled to the ground. For example, assuming that the input signal $V_i$ has a low logic level of 0V, the NFETs MN4, MN5 and MN2 are turned off. That is, the voltage level at the first input terminal (i.e. gate terminal of the NFET MN6, reference signal $V_r$) of the differential amplifier 120 is the reference voltage $V_{ref}$ (e.g. 1.2V). Meanwhile, the NFET MN1 is turned on and the output signal $V_o$ will be pulled high to the same voltage level of $V_r$ (e.g. 1.2V). For the example of VDD being 1.8V, $V_a$ is approximately 1.6V. Conversely, assuming that the input signal $V_i$ has a high logic level of 1V, the NFETs MN4, MN5, and MN2 are turned on. That is, the reference signal $V_r$ at the first input terminal (i.e. gate terminal of the NFET MN6) of the differential amplifier 120 and the output signal $V_o$ will be pulled down to 0V (i.e. ground).

Figure 3:
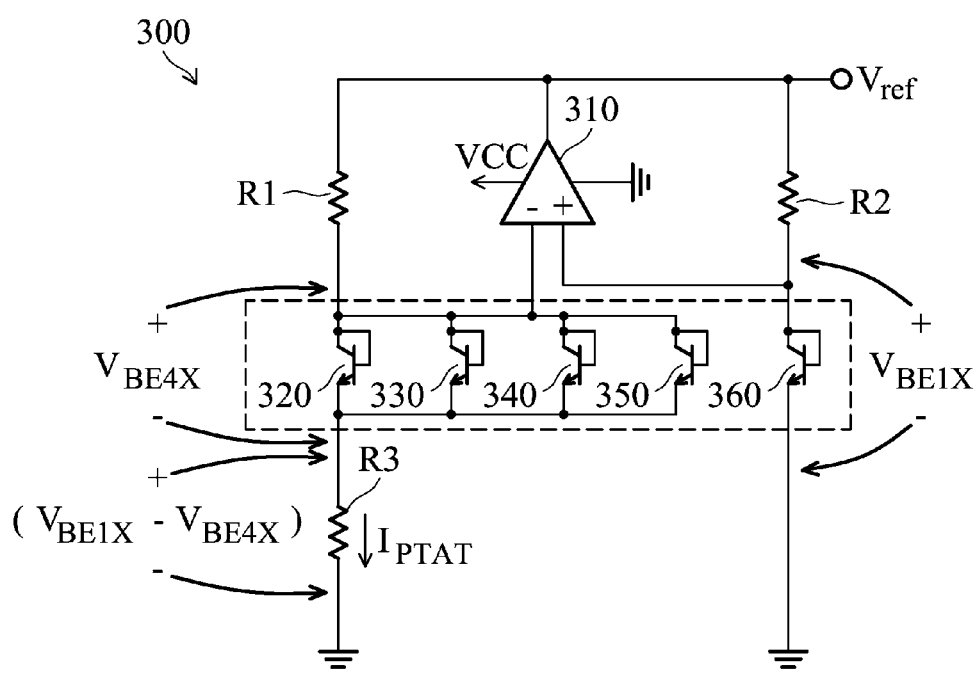
FIG. 3 is a circuit schematic diagram of a bandgap voltage reference circuit according to an embodiment of the invention.

FIG. 3 is a circuit schematic diagram of a bandgap voltage reference circuit according to an embodiment of the invention. A bandgap voltage reference circuit provides a very stable voltage reference in regard to both temperature and power supply variations. In an embodiment, the reference voltage $V_{ref}$ can be generated by a bandgap voltage reference circuit 300, as illustrated in FIG. 3. The operational amplifier 310 is supplied with a voltage power source VCC. The negative input terminal of the operational amplifier 310 is connected to the collector terminal of several identical bipolar-junction transistors (hereinafter as BJT) (e.g. BJTs 320-350) which have a common collector terminal and a common emitter terminal. The base terminals of the BJTs 320-350 are connected to their common collector terminal. The positive input terminal of the operational amplifier 310 is connected to the collector terminal of the BJT 360. The resistances R1, R2 and R3 are, for example, 5K, 5K and 390 ohms, respectively. Accordingly, the voltage across the common collector terminal and the common emitter terminal of the BJTs 320~350 may be $V_{BE4X}$, and the voltage across the collector terminal of the BJT 360 and the ground is $V_{BE1X}$. Further, the current $I_{PTAT}$ through the resistance R3 is $(V_{BE1X}-V_{BE4X})/R3$. Therefore, the generated reference voltage $V_{ref}$ of the bandgap voltage reference circuit can be calculated by the following equation:

$$V_{ref}=V_{BE1X}+(V_{BE1X}-V_{BE4X})*(5K/390)$$

It should be noted that the output voltage $V_{ref}$ of the voltage reference circuit 300 may be a constant value of 1.2V. Specifically, although the voltages $V_{BE4X}$ and $V_{BE1X}$ may vary due to temperature changes, the difference between the voltages $V_{BE4X}$ and $V_{BE1X}$ may be kept at a constant value, so that the voltage level of $V_{ref}$ can be fixed approximately at 1.2V. However, since the bandgap voltage reference circuit 300 does not have pull-up and pull-down transistors to provide driving capability, the bandgap voltage reference circuit 300 cannot provide a sufficient current for driving other circuits. Thus, the driving current of the driving circuit 100 is mainly from the output stage 130.

Figure 4A:
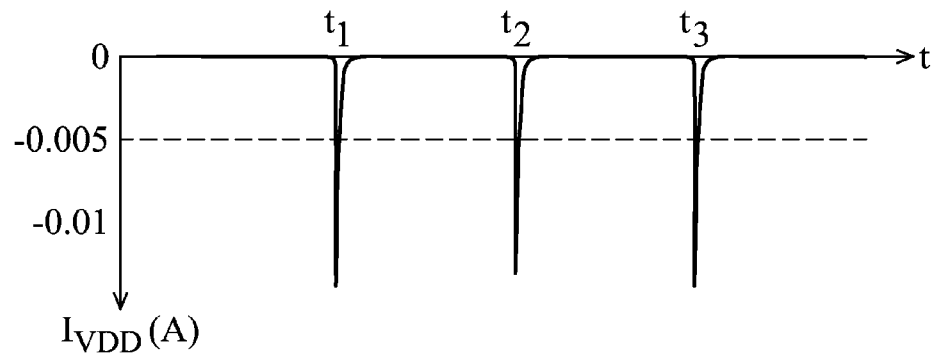
FIG. 4A to FIG. 4D are diagrams illustrating the relationship between various voltage levels and the driving current over time according to the embodiment of FIG. 2B of the invention.
Figure 4B:
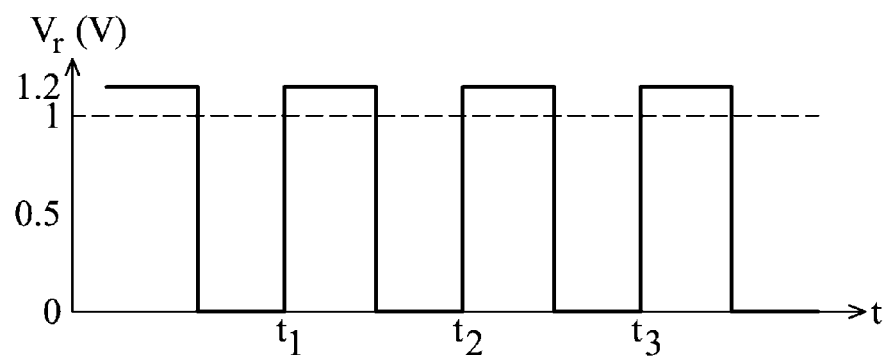
Figure 4C:
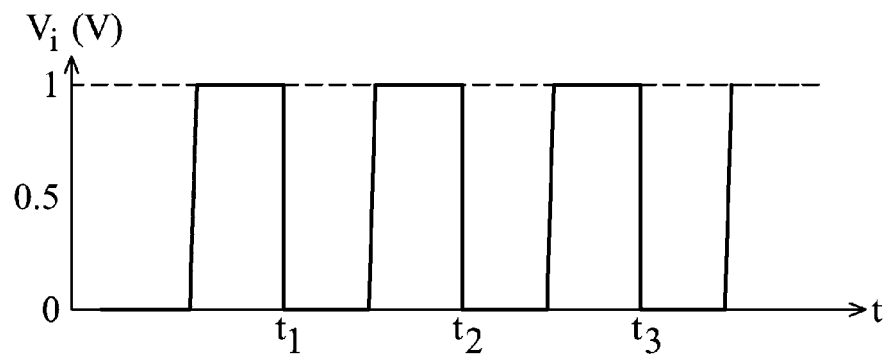
Figure 4D:
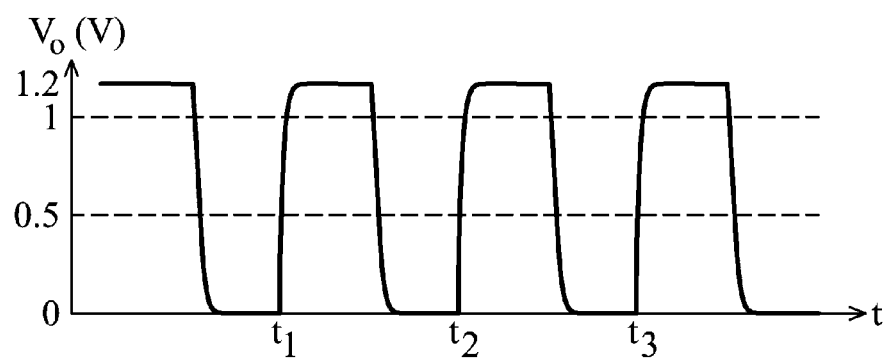

FIG. 4A to FIG. 4D are diagrams illustrating the relationship between various voltage levels and the driving current over time according to the embodiment of FIG. 2B of the invention. In this embodiment, the first voltage level is 1V, the second voltage level s 1.2V, and the third voltage level is 1.8V. As illustrated in FIG. 4B-4D, when the input signal $V_i$ has a low logic level of 0V, the reference signal $V_r$ and the output signal $V_o$ are both at a voltage level of 1.2V. When the input signal $V_i$ has a high logic level of 1V, the reference signal $V_r$ and the output signal $V_o$ are both pulled down to the voltage of 0V (i.e. ground) rapidly. It should be noted from FIG. 4A that the driving current $I_{VDD}$ (i.e., the current supplied from the operation voltage VDD, which comprises a first driving current drawn from the source terminals of the PFET pair MP1 and MP2 and a second driving current drawn from the drain terminal of the NFET pair MN1) peaks when the output signal $V_o$ transits to high logic level (i.e., pulls up), and is approximate to zero at other times including when the output signal $V_o$ is in transition from the high logic level to the low logic level. Accordingly, driving capability is provided while little steady power is consumed by the driving current $I_{VDD}$.

In view of the above, a driving circuit to provide signal voltage levels different from operation voltages is disclosed. Since the circuit design of the driving circuit is simplified, the area and the power consumption of the driving circuit can be reduced when compared with conventional designs.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A driving circuit generating an output signal according to an input signal and a reference voltage, comprising:
    a level shifter configured to receive the reference voltage with a second voltage level and the input signal with a first voltage level to generate a reference signal;
    a differential amplifier, coupled to the level shifter, having a first input terminal coupled to the reference signal, a second input terminal coupled to the output signal, and an output terminal, wherein the differential amplifier is supplied by an operation voltage with a third voltage level; and
    an output stage, coupled to the second input terminal and the output terminal of the differential amplifier, configured to receive the input signal and the operation voltage to generate the output signal, wherein the second input terminal is coupled to the output terminal of the differential amplifier according to the input signal, wherein the first voltage level is smaller than the third voltage level, and the second voltage level is between the first voltage level and the third voltage level.

2. The driving circuit as claimed in claim 1, wherein the level shifter comprises:
    a first P-type transistor, having a source terminal coupled to the reference voltage, a gate terminal coupled the input signal, and a drain terminal coupled to the reference signal; and
    a first N-type transistor, having a source terminal coupled to a ground, a gate terminal coupled the input signal, and a drain terminal coupled to the reference signal.

3. The driving circuit as claimed in claim 1, wherein the output stage comprises:
    a second N-type transistor having a gate terminal coupled to the output terminal of the differential amplifier, a drain terminal coupled to the operation voltage, and a source terminal coupled to the second input terminal of the differential amplifier;
    a third N-type transistor having a gate terminal coupled to the input signal, a drain terminal coupled to the second input terminal of the differential amplifier, and a source terminal coupled to a ground; and
    a fourth N-type transistor having a gate terminal coupled to the input signal, a drain terminal coupled to the output terminal of the differential amplifier, and a source terminal coupled to the ground,
    wherein the output signal is generated at the second input terminal of the differential amplifier.

4. The driving circuit as claimed in claim 1, wherein the differential amplifier comprises:
    a second P-type transistor having a gate terminal coupled to a drain terminal, and a source terminal coupled to the operation voltage;
    a third P-type transistor having a gate terminal coupled to the gate terminal of the second P-type transistor, a source terminal coupled to the operation voltage, and a drain terminal;
    a fifth N-type transistor having a drain terminal coupled to the drain terminal of the second P-type transistor, a source terminal, and a gate terminal;
    a sixth N-type transistor having a drain terminal coupled to the drain terminal of the third P-type transistor, a source terminal coupled to the source terminal of the fifth N-type transistor, and a gate terminal,
    wherein the gate terminal of the fifth N-type transistor is the first input terminal of the differential amplifier, the gate terminal of the sixth N-type transistor is the second input terminal of the differential amplifier, and the drain terminal of the third P-type transistor is the output terminal of the differential amplifier.

5. The driving circuit as claimed in claim 4, wherein the differential amplifier further comprises:
    a seventh N-type transistor having a gate terminal coupled to a bias voltage, a drain terminal coupled to the source terminal of the fifth N-type transistor, and a source terminal coupled to a ground,
    wherein the differential amplifier is enabled/disabled by turning on/off the seventh N-type transistor based on the bias voltage.

6. The driving circuit as claimed in claim 4, wherein the differential amplifier further comprises:
    a current source coupled between the source terminal of the fifth N-type transistor and ground.

7. The driving circuit as claimed in claim 1, wherein the reference voltage is generated by a bandgap voltage reference circuit.

8. A driving circuit generating an output signal according to an input signal with a first voltage level and a reference voltage with a second voltage level, comprising:
    a differential amplifier having a first input terminal coupled to the reference voltage, a second input terminal coupled to the output signal, and an output terminal, wherein the differential amplifier is supplied by an operation voltage with a third voltage level; and
    an output stage, coupled to the second input terminal and the output terminal of the differential amplifier, configured to receive the input signal and the operation voltage to generate the output signal, wherein the second input terminal is coupled to the output terminal of the differential amplifier according to the input signal, wherein the first voltage level is smaller than the third voltage level, and the second voltage level is between the first voltage level and the third voltage level, wherein the output stage comprises:

a first N-type transistor having a gate terminal coupled to the output terminal of the differential amplifier, a drain terminal coupled to the operation voltage, and a source terminal coupled to the second input terminal of the differential amplifier;

a second N-type transistor having a gate terminal coupled to the input signal, a drain terminal coupled to the second input terminal of the differential amplifier, and a source terminal coupled to a ground; and a third N-type transistor having a gate terminal coupled to the input signal, a drain terminal coupled to the output terminal of the differential amplifier, and a source terminal coupled to the ground, wherein the output signal is generated at the second input terminal of the differential amplifier.

9. The driving circuit as claimed in claim 8, wherein the differential amplifier comprises:

a first P-type transistor having a gate terminal coupled to a drain terminal, and a source terminal coupled to the operation voltage;

a second P-type transistor having a gate terminal coupled to the gate terminal of the first P-type transistor, a source terminal coupled to the operation voltage, and a drain terminal;

a fourth N-type transistor having a drain terminal coupled to the drain terminal of the first P-type transistor, a source terminal, and a gate terminal;

a fifth N-type transistor having a drain terminal coupled to the drain terminal of the second P-type transistor, a source terminal coupled to the source terminal of the fourth N-type transistor, and a gate terminal, wherein the gate terminal of the fourth N-type transistor is the first input terminal of the differential amplifier, the gate terminal of the fifth N-type transistor is the second input terminal of the differential amplifier, and the drain terminal of the second P-type transistor is the output terminal of the differential amplifier.

* * * * *